United States Patent [19]

Andersen

[11] 4,202,004
[45] May 6, 1980

[54] ENERGY CONVERSION UNIT

[76] Inventor: David C. Andersen, 425 First St., Los Altos, Calif. 94022

[21] Appl. No.: 944,097

[22] Filed: Sep. 20, 1978

[51] Int. Cl.² ............................................. H01L 27/14
[52] U.S. Cl. ........................................ 357/30; 357/32; 357/20; 357/88
[58] Field of Search ....................... 357/30, 32, 20, 88; 250/211 J

[56] References Cited

U.S. PATENT DOCUMENTS 4,148,052  4/1979  Nathanson ............................. 357/30

Primary Examiner—Martin H. Edlow
Attorney, Agent, or Firm—John L. McGannon

[57] ABSTRACT

A crystal of a semiconductor material has an electrically conducting loom assembly embedded therein, whereby the crystal and loom assembly define a unit which converts light or other electromagnetic radiation into an electrical current for flow to an external electrical circuit. The loom assembly has a plurality of electrodes coated with another semiconductor material so that the semiconductor materials define a plurality of n-p junctions within the crystal. Radiation absorbed by the crystal will liberate electrons which will flow across the junctions and along electrical paths formed in the loom assembly to conductor means which can be connected to an external electrical circuit. The loom assembly comprises a plurality of very small loom units comprised of pairs of spaced electrodes, one of the electrodes of each loom unit having a coating of a semiconductor material in contact with the semiconductor material of the crystal. The loom assembly can be made by laser cut tooling and the crystal can be grown on the loom assembly. The crystal can be mounted in any suitable manner to receive solar energy, such as in optical alignment with a lens system or at the focus of a curved mirror.

9 Claims, 8 Drawing Figures

FIG. 4
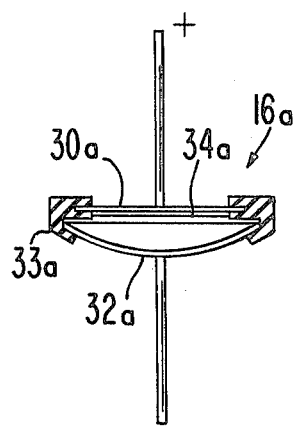
FIG. 5
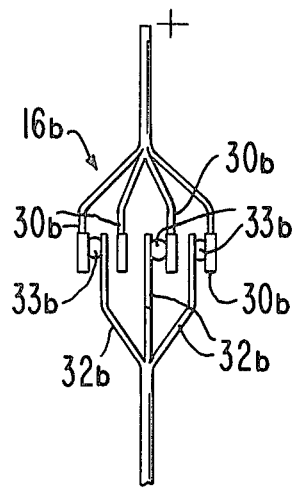
FIG. 6
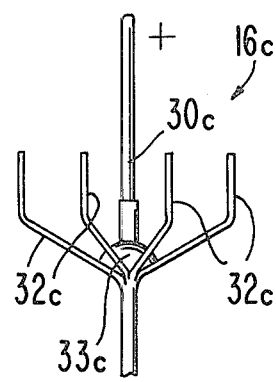
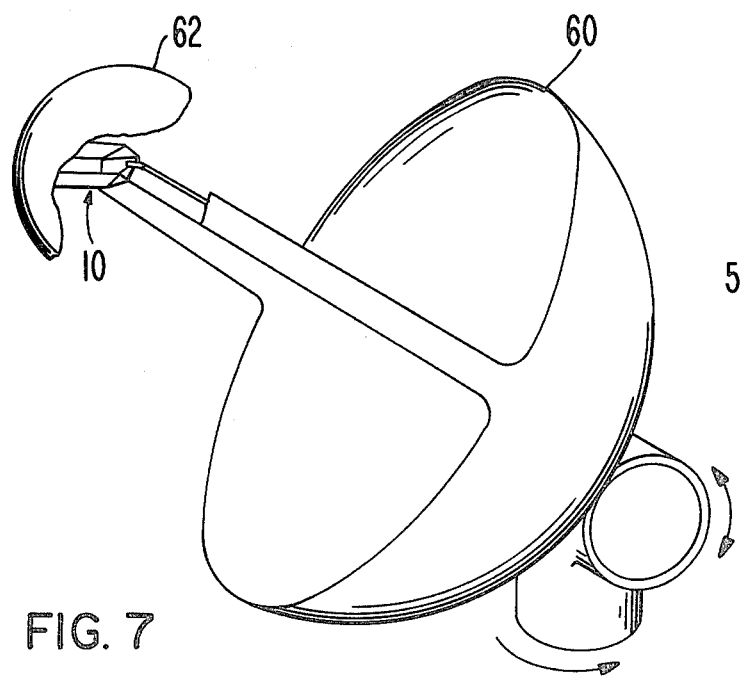
FIG. 7
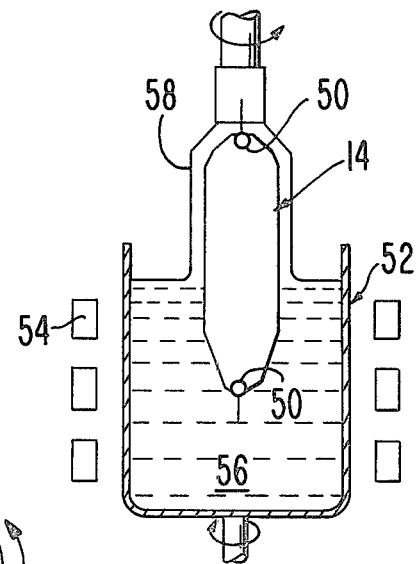
FIG. 8

ENERGY CONVERSION UNIT

This invention relates to improvements in energy conversion units and, more particularly, to a photosensitive crystal having conductor means embedded therein for forming a great many n-p junctions and electrical current flow paths therein.

BACKGROUND OF THE INVENTION

Photovoltaic devices have been produced and used in the past with a certain amount of success. Devices of this type operate to produce a voltage in a non-homogeneous semiconductor, such as silicon, by the absorption of light or other electromagnetic radiation. In its simplest form, the photovoltaic effect occurs in the common photovoltaic cell used, for example, in solar batteries and exposure meters for cameras.

A photovoltaic cell consists of an n-p junction between two different semiconductor materials, namely, an n-type material in which conduction is due to electrons, and a p-type material in which conduction is due to positive holes. When light is absorbed near such a junction, electrons and holes are liberated in respective materials, the electrons which are liberated defining an electrical current flow along a path through the cell. The liberated electrons can then flow in an external circuit without the need for a battery as is required in conventional photoconductive devices. If the external circuit is broken, an open circuit photovoltage appears across the cell when the latter is subjected to light or other electromagnetic radiation.

While conventional photovoltaic cells have been satisfactorily used in a number of different applications, they are generally limited in power output because of the relatively large size which they must have to provide a usable power output. Moreover, they have a high production cost per unit of output power in comparison with other electrical devices. Since a cell of this type, to have a moderately high power output, must be relatively large, requires a relatively large operating space during use. This factor limits its portability and often requires special mounts which add to the overall cost per unit of output power derived from the cell.

Because of the foregoing limitations, a need has arisen for an improved energy conversion unit which uses the photovoltaic effect and which provides a high power output at low cost.

SUMMARY OF THE INVENTION

The present invention satisfies the foregoing need by providing an improved energy conversion unit and a method of making the same wherein the conversion unit operates to produce a photovoltaic effect in a manner which allows the unit to be capable of providing a higher power output than conventional photovoltaic devices. Moreover, the conversion unit of this invention is simple and rugged in construction and is compact in size and is highly portable so that it can be moved from place to place and can be readily mounted for use with a minimum of expense.

To achieve the foregoing aims, the energy conversion unit of this invention comprises a crystal having an electrically conducting loom structure embedded therein with the loom structure presenting a great many loom units having spaced electrodes and conductor leads which form electrical current flow paths through the crystal. The crystal is formed from a body of non-homogeneous, n-type semiconductor material which can absorb light or other electromagnetic radiation to liberate electrons in the body for flow toward the loom assembly. A typical n-type semiconductor material for this purpose is silicon or cadmium sulfide.

The crystal is preferably grown on the loom assembly so that the crystal material fills the spaces between the loom units, the electrodes of the loom units, and the conductor leads connecting the loom units with a pair of electrical conductors at the ends of the crystal. The crystal is grown on the loom assembly is in its natural state and thereby requires no costly crystal cutting to render the conversion unit operational.

The loom assembly is formed in any suitable manner, such as by molding the electrodes with laser cut tooling procedures and by forming the conductor leads and conductors by microwiring techniques. The electrodes can be either die-cast or forged. Each loom unit has a first electrode which is coated with a p-type semiconductor material so that the first electrode becomes a collector of electrons liberated when light or other electromagnetic radiation is absorbed in n-type material of the crystal. The reason for this is that the n-type material of the crystal and the p-type material on the first electrodes define a great many n-p junctions across which electrons liberated by the absorption of electromagnetic radiation flow through the crystal and loom assembly for passage to an external electrical circuit.

The conversion unit, after the formation of the crystal on the loom assembly, is immediately operational and can be put to use in any one of a number of different ways. For instance, the conversion unit can be placed in optical alignment with a lens assembly so as to focus sunlight or other electromagnetic radiation in the interior of the crystal. In another application, the conversion unit can be placed at the focus of a curved mirror so that radiation can be absorbed by the crystal. In the latter case, cooling of the crystal may be required to prevent structural damage thereto due to heat absorbed thereby.

The primary object of this invention is to provide an improved energy conversion unit operating to provide a photovoltaic effect wherein a crystal capable of absorbing light or other electromagnetic radiation will liberate electrons which will be directed toward and flow through a unique, electrically conducting loom assembly embedded in the crystal so that the liberated electrons can flow out of the crystal to an external circuit electrically coupled to the loom assembly.

Another object of the present invention is to provide an energy conversion unit of the type described which is simple and rugged in construction, gives a higher power output at lower cost than conventional photovoltaic devices, yet is extremely compact in size and is highly portable so that it can be readily mounted in the natural state of the crystal with a minimum of expense.

A further object of the present invention is to provide a conversion unit of the type described and a method of making the unit wherein the loom assembly is embedded in a non-homogeneous n-type semiconductor material defining the crystal with the loom assembly having a plurality of electrodes coated with a p-type semiconductor material, so that the semiconductor materials define a great many n-p junctions across which electrons flow after the electrons have been liberated and the electron flow will provide a higher power output than that obtainable from a conventional photovoltaic cell of comparable physical size.

IN THE DRAWINGS

FIGS. 4, 5 and 6 are side views of several embodiments of a loom unit of the present invention, showing the way in which the electrodes of the loom unit are held in space relationship to each other for manufacture of the loom assembly;

FIG. 7 is a perspective view of a mirror assembly showing a way in which the energy conversion unit can be used; and FIG. 8 is a schematic view of an evacuation chamber for use in growing the crystal on the loom assembly.

The energy conversion unit of the present invention is broadly denoted by the numeral 10 and includes a crystal 12 which has an electrically conducting loom assembly 14 embedded therein. Crystal 12 and loom assembly 14 are constructed to provide a plurality of n-p junctions within the crystal so that electrons liberated when sunlight or other electromagnetic radiation is absorbed by the crystal will flow into and through the loom assembly and outwardly of the crystal to an external electrical circuit electrically connected to the loom assembly.

Figure 1:
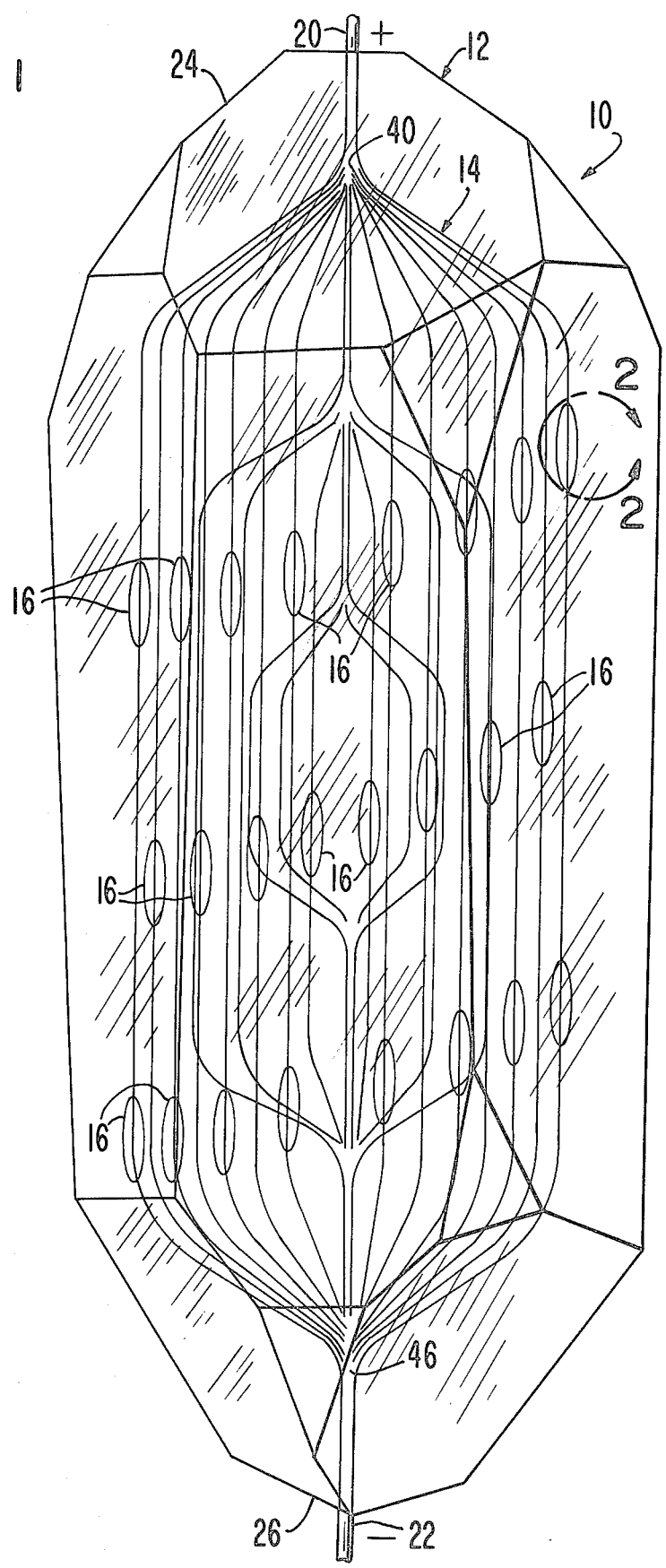
FIG. 1 is a side elevational view of the energy conversion unit of the present invention, showing a loom assembly embedded in a crystal.

Loom assembly 14 has a great many loom units 16, each loom unit being comprised of a pair or more of spaced electrodes of very small size. As shown in FIG. 1, the loom units 16 are denoted by elliptical lines and are relatively few in number; however, in practice, there will be hundreds of such loom units 16 and they will be typically uniformly distributed throughout the interior of the crystal with all of the loom units 16 being electrically coupled to a pair of electrical conductors 20 and 22 which project outwardly from respective ends 24 and 26 of crystal 12. Conductors 20 and 22 are used to electrically connect loom assembly 14 to an electrical circuit of crystal 12.

Figure 2:
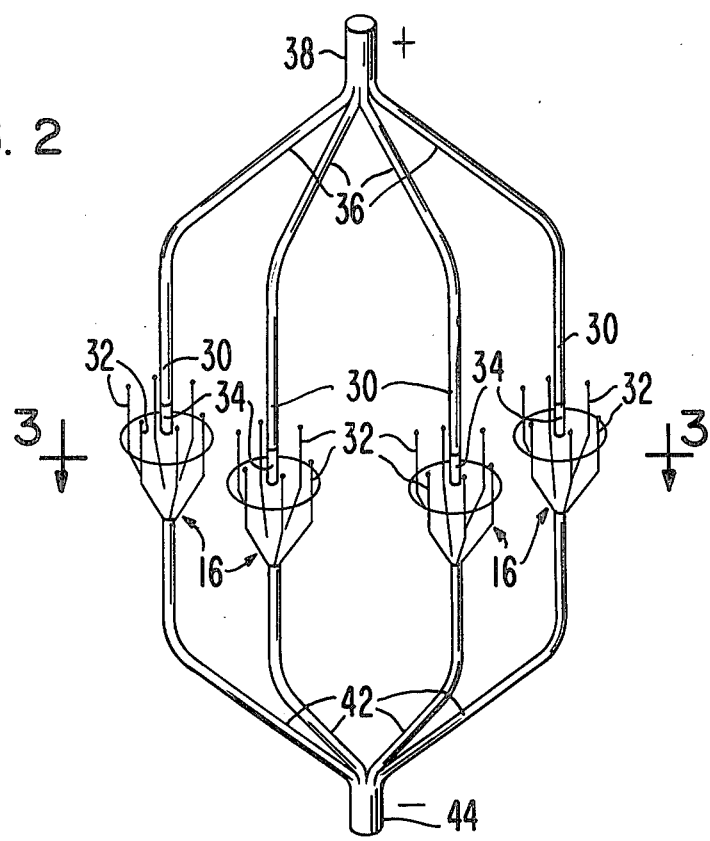
FIG. 2 is an enlarged, fragmentary perspective view of the part of the loom assembly, taken within circular line 2—2 of FIG. 1.
Figure 3:
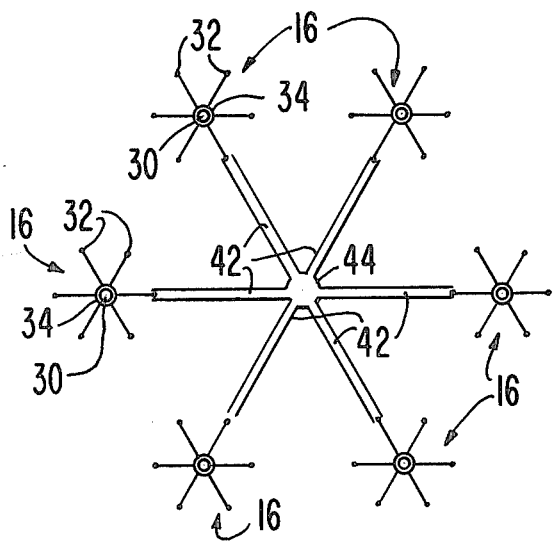
FIG. 3 is a cross-sectional view taken along line 3—3 of FIG. 2.

Each loom unit 16 is in parallel with a number of other loom units 16. As shown in FIG. 2, there are four loom units 16 in parallel with each other but, in practice, there will be a much greater number, such as several hundred loom units 16 grouped together in parallel with each other.

Each loom unit 16 includes a first electrode surrounded by a number of generally parallel, spaced second electrodes 32. The cross-sectional area and length of each of electrodes 30 and 32 are very small so that a great many loom units can be packed in a relatively small space.

Each electrode 30 is coated with a p-type semiconductor material, such a cuprous silfide ($CU_2S$). Also, each electrode 30 is coupled by a conducting lead 36 to a common conductor 38 which along with other identical conductors 38 associated with other groups of loom units 16, are joined at junction 40 and are electrically connected to conductor 20 (FIG. 1).

Similarly, the second electrodes 32 of each loom unit 16 are electrically connected by a conductor lead 42 to a common conductor 44, which along with other identical conductors 44 associated with other groups of loom units 16, are joined at a junction 46 (FIG. 1) and are electrically connected to conductor 22. Electrodes 22 are uncoated.

As described above and as shown in FIG. 1, loom assembly 16 is in the form of a plurality of elongated, spaced, generally parallel strings of loom units 16. Each such string includes a group of loom units 16, conducting leads 36 and 42, and conductors 38 and 44 as shown in FIG. 2. The loom units 16 of each string are in parallel with each other as shown in FIG. 2. The electrodes 30 and 32 of each loom unit 16 formed in any suitable manner, such as by laser cut tooling techniques. They may be either die-cast or forged. After being formed, electrodes 30 are then provided with the coating 32 of p-type material. Once the loom units 16 are made, conducting leads 36 and 42 and conductors 38 and 44 can be constructed by using microwiring technology as well as computer alignment of laser welding and gluing procedures with the use of electron microscope feedback systems.

While loom units 16 may be constructed as shown in FIG. 2, they can also be constructed in the manner as shown in any of FIGS. 4, 5 and 6. For instance, FIG. 4 shows a loom unit 16a having a first electrode 30a with a coating 34a and a uncoated electrode 32a, electrodes 30a and 32a being connected together by a mass 33a of a non-conductive glue material which holds the electrodes apart to allow crystal 12 to be grown on loom assembly 14 as hereinafter described. The melting point of material 33a will be higher than that of the material of crystal 12 so that the material will not be affected during the growing of the crystal on the loom assembly.

FIG. 5 shows a loom unit 16b having a number of first, spaced, coated, generally parallel electrodes 30a adjacent to a like number of spaced, generally parallel second electrodes 32b, several of the first and second electrodes being held apart by non-conductive glue masses 33b to maintain the dimensional stability of loom unit during formation of the crystal. FIG. 6 shows a loom unit 16c having a first coated electrode 30c surrounded by a number of spaced, second electrodes 32c, the collector being stabilized with reference to the second electrodes 32c by a mass 33c of a non-conductive glue.

To form conversion unit 10, crystal 12 is grown around and loom through assembly 14 after the various strings of loom units 16 thereof have been coupled together. To form the crystal, loom assembly 14 is first made. Assembly 14 is then provided with a seed 50 at each of its ends, the seeds being of the n-type semiconductor material which is to form crystal 12. For instance, the material can be nonhomogeneous silicon or cadmium sulfide.

With seeds 50 attached to loom assembly 14, the assembly is placed in a crystal growth chamber 52 having an external heater 54 surrounding the same. The chamber will contain a mass 56 of the n-type semiconductor material in a molten state, and the chamber will be closed by a cover 58 which allows loom assembly 14 to be lowered into the molten material. After the assembly and seeds are lowered into the molten material, chamber 52 is filled with argon to provide an inert atmosphere for the growth of the crystal. After a lapse of a predetermined crystal growth period, the crystal and loom assembly 14 embedded therein are lifted from chamber 52 and define conversion unit 10.

The material of crystal will fill all spaces within and about assembly 14 and will form a solid, integral construction which is highly portable and compact in comparison to present solar cell systems. Conversion unit 10 will be ready for use and needs no costly crystal cutting procedures before it can be put into use.

Since the material of crystal 12 will fill all open spaces of loom assembly 14, there will be formed a great many n-p junctions where the crystal material engages coatings 34 on electrodes 30. It is across these junctions that electrons flow when the electrons are liberated by sunlight or other electromagnetic radiation absorbed by crystal 12. The electrons will then flow through the loom assembly and outwardly of the crystal to an external electrical circuit as described above.

In use, conversion unit 10 is mounted so as to be subjected to sunlight or other radiation which can penetrate the crystal and cause the liberation of electrons as mentioned above. A number of methods can be used to provide a highly concentrated beam of electromagnetic radiation focused onto conversion unit 10. One technique is to use a lens system to focus the radiation into the interior of crystal 12. Another technique is to use a pair of parabolic mirrors 60 and 62 (FIG. 7), mirror 60 having a much greater size than mirror 62. Energy conversion unit 10 is placed at the foci of both mirrors 60 and 62, mirror 60 being operable to focus the radiation on crystal 10 and mirror 62 operating to catch and return radiation refracted from unit 10. It is possible that a large amount of heat will be generated with the technique of FIG. 7. Thus, a cooling system may be found necessary for use with unit 10 or, in the alternative, some type of filtering can be used to filter the infra-red portion of the radiation before it strikes unit 10.

I claim:

1. An energy conversion unit comprising: a body of an n-type semiconductor material capable of permitting electrons to be liberated therefrom when electromagnetic radiation is absorbed by the body, there being an electrically conducting loom assembly embedded in the body, said assembly being comprised of a plurality of loom units, each loom unit having an electrode with a p-type semiconductor material thereon and means coupled with the electrode for defining an electrical current flow path extending away therefrom, said semiconductor materials defining a plurality of n-p junctions across which liberated electrons flow to the electrodes and along said current flow paths; and conductor means coupled to the loom assembly and extending outwardly from the crystal for connecting said current flow paths to an electrical circuit externally of the body.

2. An energy conversion unit as set forth in claim 1, wherein each loom unit includes a pair of spaced electrodes, a first of the electrodes of each pair having a coating of said p-type material thereon, the other electrode of each pair being free of a coating and being in electrical engagement with said n-type material of the body.

3. An energy conversion unit as set forth in claim 1, wherein each loom unit includes a number of second electrodes in surrounding, spaced relationship to the corresponding first-mentioned electrode, said second electrodes being of electrically conducting material in engagement with the semiconductor material of said body.

4. An energy conversion unit as set forth in claim 1, wherein said loom assembly comprises a plurality of spaced, generally parallel strings of loom units, the loom units of each string being in parallel relationship to each other.

5. An energy conversion unit as set forth in claim 4, wherein said conductor means includes a pair of electrical conductors secured to and extending outwardly from the body, each of said strings having a pair of opposed ends coupled to respective conductors.

6. An energy conversion unit as set forth in claim 4, wherin said loom assembly is in a three-dimensional space within said body with some of the strings of loom units being in surrounding, spaced relationship to the other strings.

7. An energy conversion unit as set forth in claim 1, wherein the n-type material is non-homogeneous silicon.

8. An solar energy conversion unit as set forth in claim 1, wherein the n-type material is cadmium sulfide.

9. An energy conversion unit as set forth in claim 1, wherein the body comprises a crystal grown on said loom assembly to embed the latter in the body.

* * * * *